US009147696B2

(12) United States Patent  
Wan et al.

(10) Patent No.: US 9,147,696 B2  
(45) Date of Patent: Sep. 29, 2015

(54) DEVICES AND METHODS OF FORMING FINFETS WITH SELF ALIGNED FIN FORMATION

(71) Applicant: GLOBALFOUNDRIES Inc., Grand Cayman (KY)

(72) Inventors: Jing Wan, Malta, NY (US); Andy Wei, Queensbury, NY (US); Lun Zhao, Ballston Lake, NY (US); Dae Geun Yang, Watervliet, NY (US); Jin Ping Liu, Ballston Lake, NY (US); Tien-Ying Luo, Clifton Park, NY (US); Guillaume Bouche, Albany, NY (US); Mariappan Hariharaputhiran, Ballston, NY (US); Churamani Gaire, Clifton Park, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 42 days.

(21) Appl. No.: 14/043,243

(22) Filed: Oct. 1, 2013

(65) Prior Publication Data  
US 2015/0091094 A1    Apr. 2, 2015

(51) Int. Cl.  
H01L 27/12   (2006.01)  
H01L 21/762  (2006.01)  
H01L 21/84   (2006.01)

(52) U.S. Cl.  
CPC ...... H01L 27/1211 (2013.01); H01L 21/76224 (2013.01); H01L 21/845 (2013.01)

(58) Field of Classification Search  
CPC ............... H01L 21/823431; H01L 21/823821; H01L 21/845  
See application file for complete search history.

(56) References Cited

U.S. PATENT DOCUMENTS 7,993,999 B2 * 8/2011 Basker et al. ................ 438/199  
2011/0183508 A1 * 7/2011 Chan et al. ................... 438/591

OTHER PUBLICATIONS

M. Guillorn, et al. "FinFET Performance Advantage at 22nm: An AC Perspective", 2008 Symposium on VLSI Technology Digest of Technical Papers, 2 pages.

* cited by examiner

Primary Examiner — Matthew W Such  
Assistant Examiner — Robert Carpenter  
(74) Attorney, Agent, or Firm — Heslin Rothenberg Farley & Mesiti P.C.

(57) ABSTRACT

Devices and methods for forming semiconductor devices with FinFETs are provided. One method includes, for instance: obtaining an intermediate semiconductor device with a substrate and at least one shallow trench isolation region; depositing a hard mask layer over the intermediate semiconductor device; etching the hard mask layer to form at least one fin hard mask; and depositing at least one sacrificial gate structure over the at least one fin hard mask and at least a portion of the substrate. One intermediate semiconductor device includes, for instance: a substrate with at least one shallow trench isolation region; at least one fin hard mask over the substrate; at least one sacrificial gate structure over the at least one fin hard mask; at least one spacer disposed on the at least one sacrificial gate structure; and at least one pFET region and at least one nFET region grown into the substrate.

7 Claims, 23 Drawing Sheets

US 9,147,696 B2

DEVICES AND METHODS OF FORMING FINFETS WITH SELF ALIGNED FIN FORMATION

FIELD OF THE INVENTION

The present invention relates to semiconductor devices and methods of fabricating semiconductor devices, and more particularly, to FinFETs and methods of fabricating semiconductor devices with self aligned fin formation and a source and drain junction compatible with planar fabrication processes.

BACKGROUND OF THE INVENTION

Conventional planar MOSFET devices have been scaling down over the last few decades to provide higher integration density, higher operation speed and lower cost. However, the scaling down of MOSFET devices is restricted by the short channel effect which causes a high leakage current. In order to counteract the short channel effect, FinFETs have started being used due to the FinFETs stronger gate electrostatic control over the channel which can mitigate the short channel effect. However, the fabrication of FinFETs is more challenging than conventional planar device fabrication because of the high topology of the fins.

During conventional FinFET fabrication, the fin is formed first. Then the gate, spacer and junction/contact may be formed. As the gate, spacer and junction are formed they must be formed over and around the high topology fins. The high topology fins may cause challenges during deposition, lithography and etching to form the gate, spacer, and junction. Further, epitaxy must be grown on the three dimensional fin rather than the previous two dimensional planar substrate, this results in less epitaxy volume on the three dimensional fin than was previously on the planar substrate thereby limiting the stress enhancement. With a limited epitaxy volume on the three dimensional fins, the silicidation cannot consume too much epitaxy material. Currently, titanium silicide is being used because it consumes less epitaxy, however titanium silicide has poor contact properties.

Thus, the fabrication of FinFET devices can be problematic with existing fabrication techniques and improved FinFET fabrication techniques are needed for forming FinFET devices to improve the performance of the resultant semiconductors.

BRIEF SUMMARY

The shortcomings of the prior art are overcome and additional advantages are provided through the provision, in one aspect, a method includes, for instance: obtaining an intermediate semiconductor device with a substrate and at least one shallow trench isolation region; depositing a hard mask layer over the intermediate semiconductor device; etching the hard mask layer to form at least one fin hard mask; and depositing at least one sacrificial gate structure over the at least one fin hard mask and at least a portion of the substrate.

In another aspect, an intermediate semiconductor device which includes, for instance: a substrate with at least one shallow trench isolation region; at least one fin hard mask over the substrate; at least one sacrificial gate structure over the at least one fin hard mask; at least one spacer disposed on the at least one sacrificial gate structure; and at least one pFET region and at least one nFET region grown into the substrate.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Aspects of the present invention and certain features, advantages, and details thereof, are explained more fully below with reference to the non-limiting embodiments illustrated in the accompanying drawings. Descriptions of well-known materials, fabrication tools, processing techniques, etc., are omitted so as to not unnecessarily obscure the invention in detail. It should be understood, however, that the detailed description and the specific examples, while indicating embodiments of the invention, are given by way of illustration only, and are not by way of limitation. Various substitutions, modifications, additions and/or arrangements within the spirit and/or scope of the underlying inventive concepts will be apparent to those skilled in the art from this disclosure. Note also that reference is made below to the drawings, which are not drawn to scale for ease of understanding, wherein the same reference numbers used throughout different figures designate the same or similar components.

Generally stated, disclosed herein are certain novel FinFET device formation methods and FinFET structures, which provide advantages over the above noted, existing FinFET device fabrication processes and structures. Advantageously, the FinFET device fabrication processes disclosed herein provide for a FinFET fabrication process with self aligned fin formation and easier fabrication of source and drain epi contacts. The FinFET fabrication process enables fin lines to be etched into a hard mask without etching into the substrate. Thus, during fabrication the device has a low topology and the spacer, source and drain junction or epitaxy contact may be formed without having to work around the fin. After the spacer and source and drain are formed, the fin may be etched into the substrate during the replacement metal gate (RMG) process allowing for the fin to be self aligned to the gate.

Figure 1:
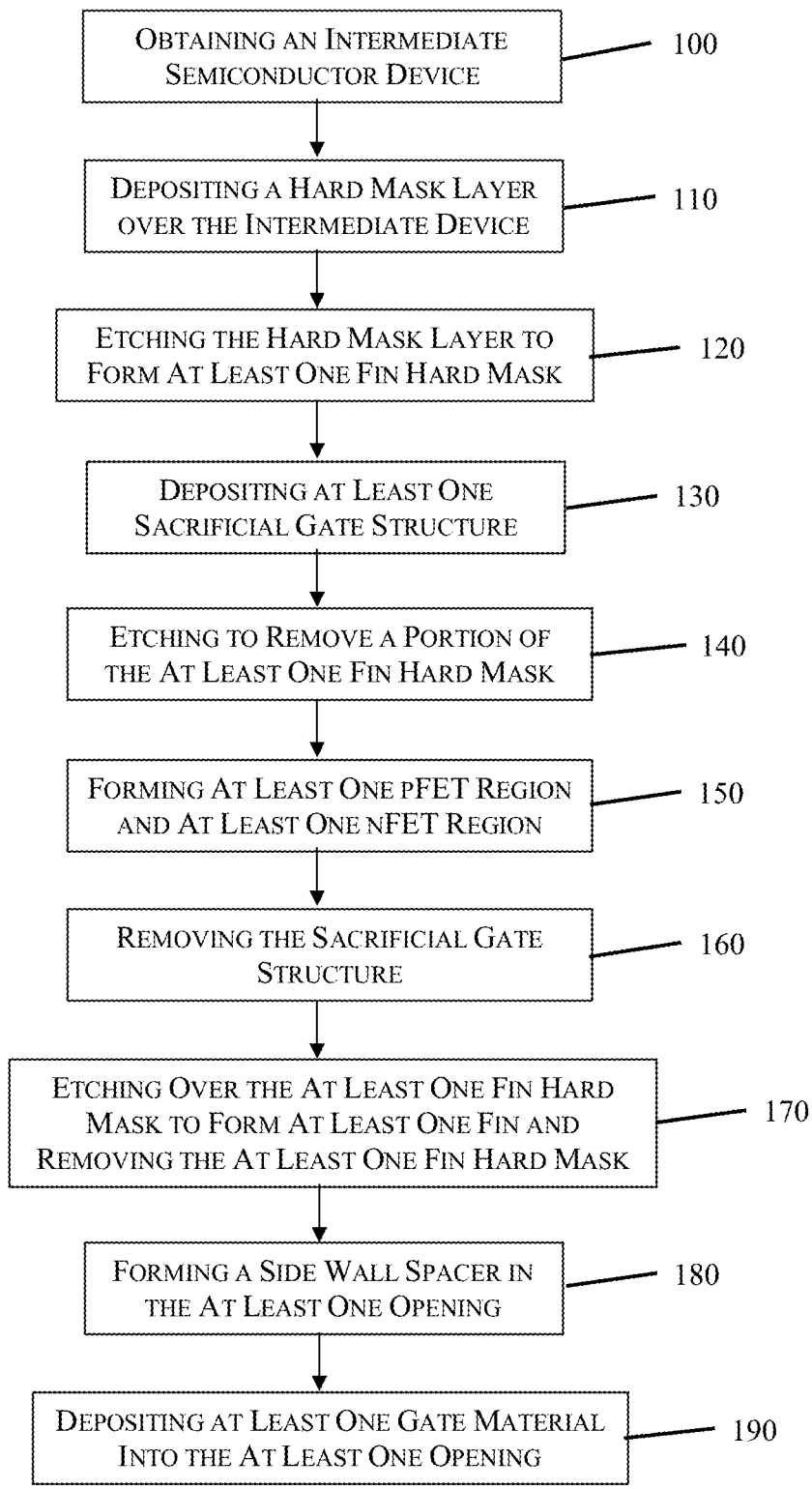
FIG. 1 depicts one embodiment of a process for fabricating, for instance, semiconductor devices with self aligned fin formation and source and drain contact compatible with the planar process, in accordance with one or more aspects of the present invention.

In one aspect, in one embodiment, as shown in FIG. 1, FinFET device formation in accordance with one or more aspects of the present invention may include, for instance: obtaining an intermediate semiconductor device 100; depositing a hard mask layer over the intermediate semiconductor device 110; etching the hard mask layer to form at least one fin hard mask 120; depositing at least one sacrificial gate structure over the at least one fin hard mask and the substrate 130; etching the intermediate semiconductor device to remove a portion of the at least one fin hard mask using the at least one sacrificial gate structure as a mask 140; forming at least one pFET region and at least one nFET region 150; removing the at least one sacrificial gate structure to create at least one opening 160; etching over the at least one fin hard mask to form at least one fin and removing the at least one fin hard mask 170; forming a side wall spacer in the at least one opening 180; and depositing at least one gate material into the at least one opening 190.

FIGS. 2-18 depict, by way of example only, one detailed embodiment of a FinFET device formation process of FIG. 1, and the resultant FinFET structure, in accordance with one or more aspects of the present invention. Note again that these figures are not drawn to scale in order to facilitate understanding of the invention, and that the same reference numerals used throughout different figures designate the same or similar elements.

Figure 2:
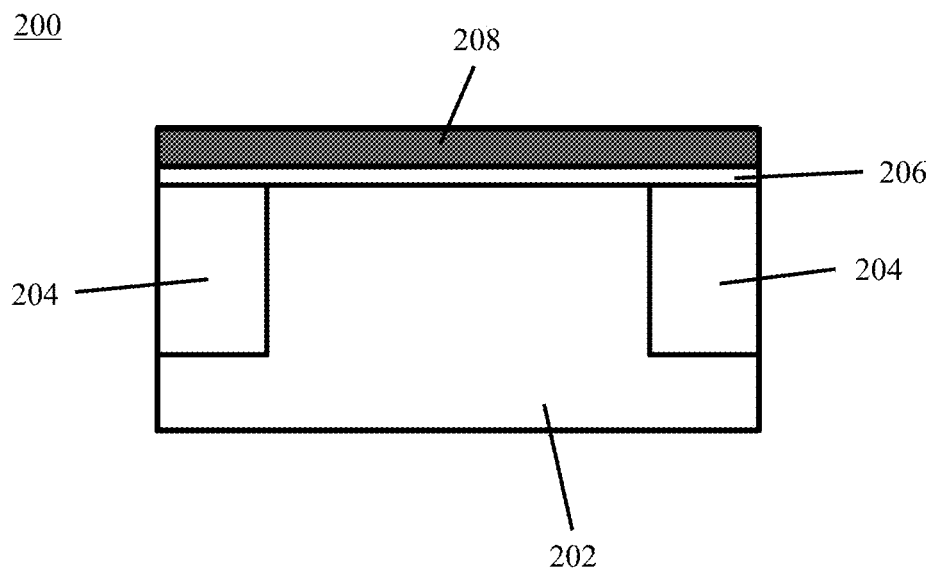
FIG. 2 depicts one embodiment of an intermediate semiconductor device with a fin hard mask layer applied over the device, in accordance with one or more aspects of the present invention.

An intermediate semiconductor device 200 is schematically illustrated in FIGS. 2-18 at several intermediate stages of manufacturing. The terms "intermediate semiconductor device," "intermediate device," "semiconductor device," and "device" may be used interchangeably herein. The semiconductor device 200, as shown in FIG. 2, may have been processed through, for example, shallow trench isolation (STI) and well doping. As depicted in FIG. 2, the intermediate device 200 may include a substrate 202 which may be made of, for example, a semiconductor material. The semiconductor material may include, e.g., silicon, germanium, a compound semiconductor material, a layered semiconductor material, a silicon-on-insulator (SOI) material, a SiGe-on-insulator (SGOI) material, a germanium-on-insulator (GOI) material, and/or the like. The intermediate structure 200 may also include at least one shallow trench isolation (STI) region 204 in the substrate 202. The intermediate structure 200 may further include a first oxide layer 206, for example, a sacrificial gate oxide, deposited over the substrate 202 and the at least one STI region 204. A fin hard mask layer 208, for example, a SiN layer, may be applied over the first oxide layer 206.

Figure 3A:
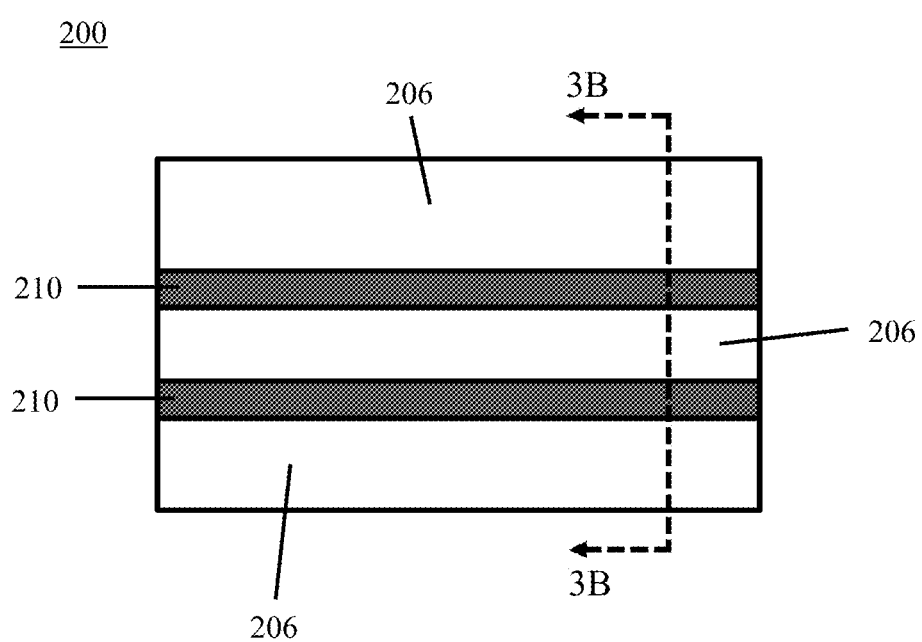
FIGS. 3A-3B depict the intermediate device of FIG. 2 after etching to create at least one fin hard mask, in accordance with one or more aspects of the present invention.
Figure 3B:
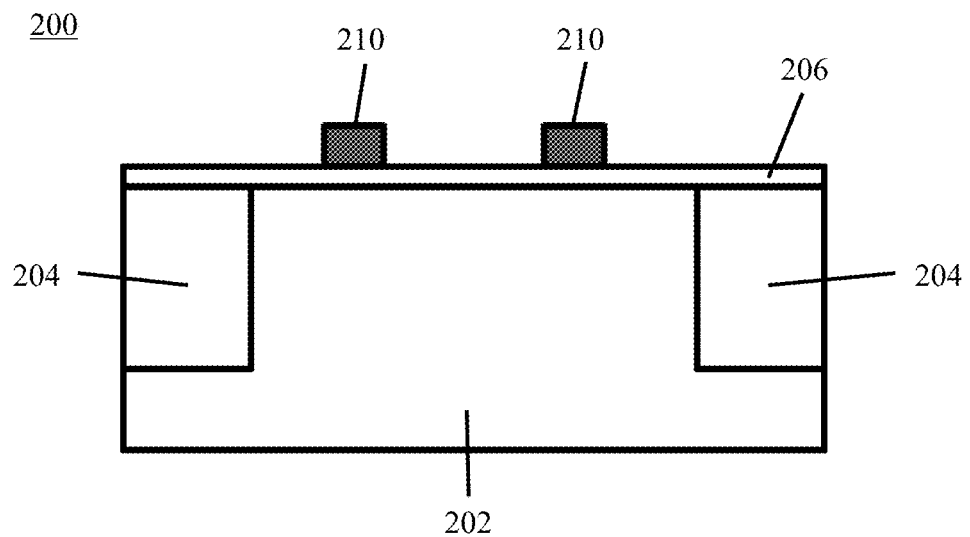

As shown in FIGS. 3A-3B, the intermediate device 200 may be patterned with, for example, lithography and then the fin hard mask layer may be etched to form at least one fin hard mask 210. By way of specific example, two fin hard masks 210 are shown in FIGS. 3A and 3B. The fin hard mask 210 enables the device 200 to have a low topology during spacer and junction formation.

Figure 4A:
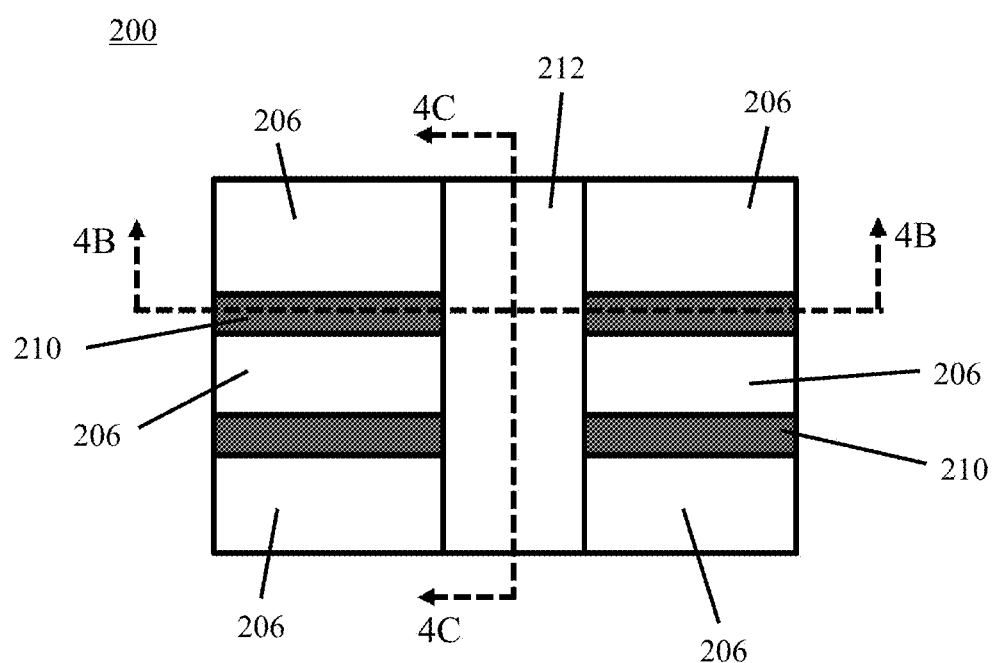
FIGS. 4A-4C depict the intermediate device of FIGS. 3A-3B after forming a sacrificial gate structure over the at least one fin hard mask, in accordance with one or more aspects of the present invention.
Figure 4B:
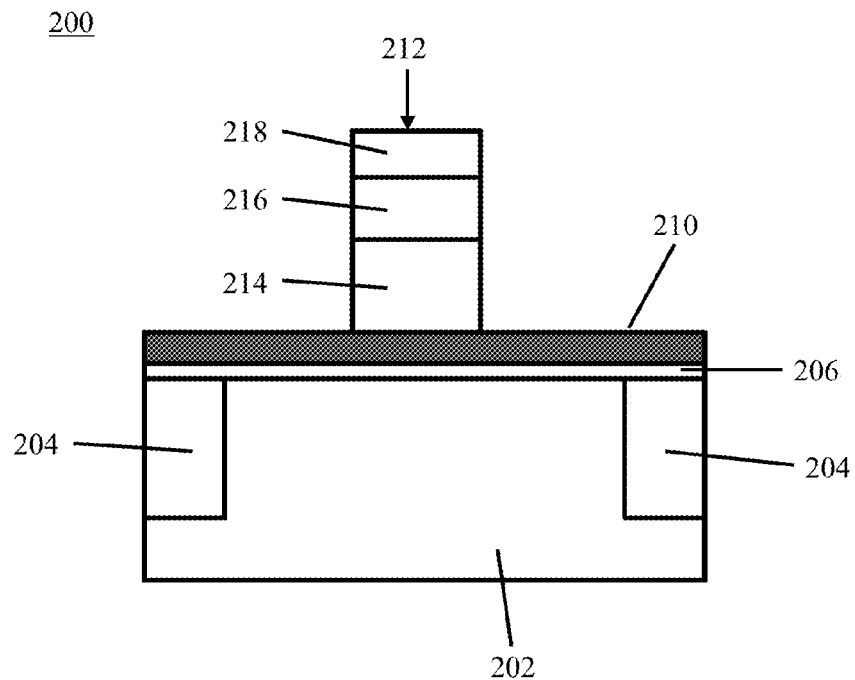
Figure 4C:
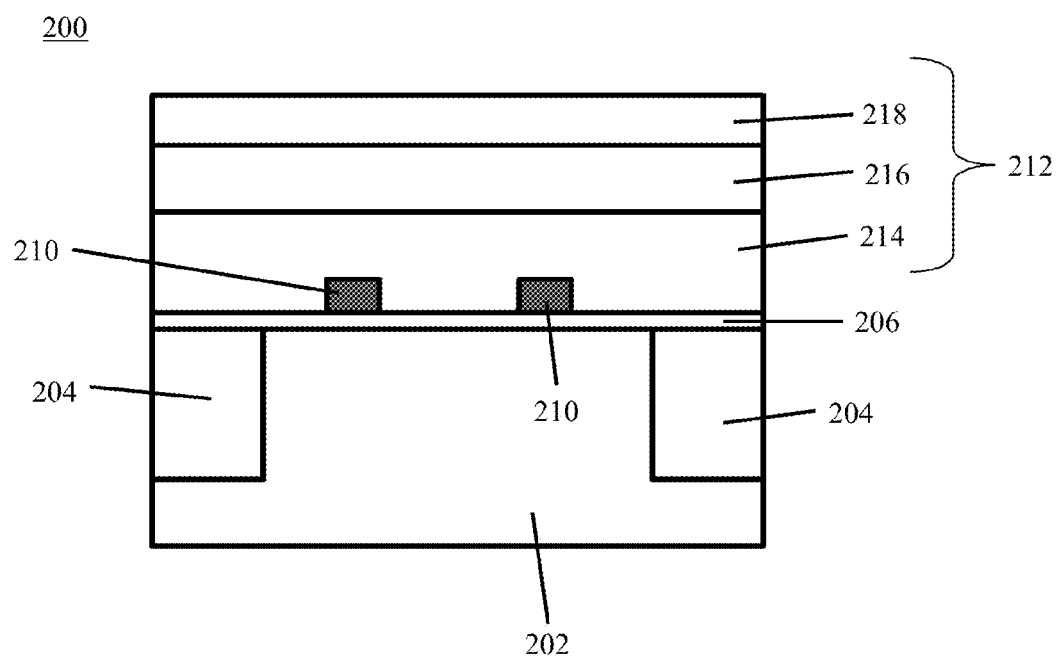

FIGS. 4A-4C show the intermediate device 200 after a sacrificial gate structure 212 is applied over the at least one fin hard mask 210 and a portion of the first oxide layer 206. The sacrificial gate structure 212 may include a sacrificial material 214, for example, an a-Si, a mask 216 made of, for example, SiN, and an oxide material 218 made of, for example, $SiO_2$. The sacrificial gate structure 212 may be formed using known methods, which may include, for example, deposition, lithography, polygate etching, and cut mask etching.

Figure 5A:
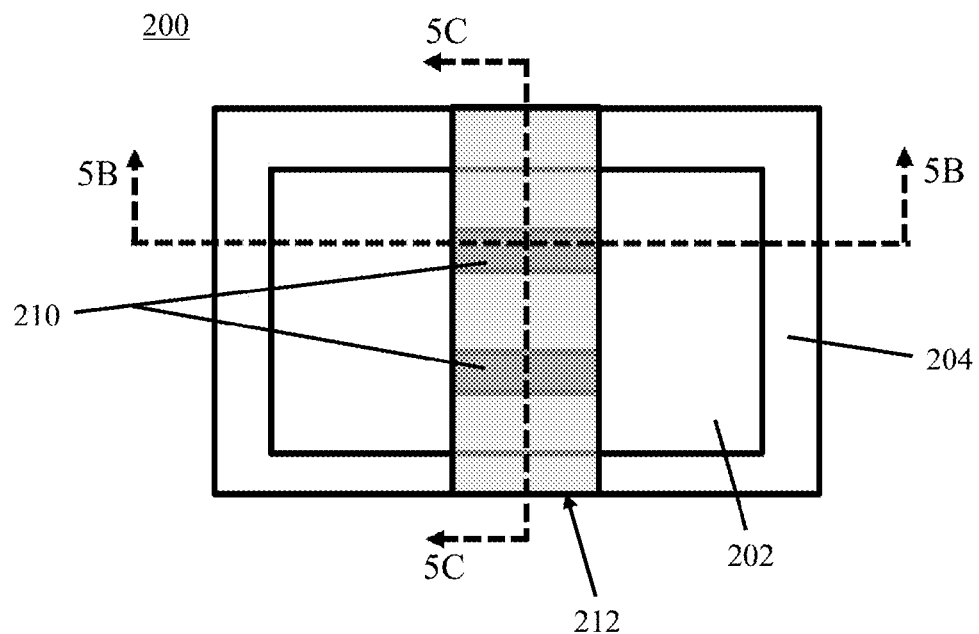
FIGS. 5A-5C depict the intermediate device of FIGS. 4A-4C after etching of the at least one fin hard mask and a portion of the first oxide layer, in accordance with one or more aspects of the present invention.
Figure 5B:
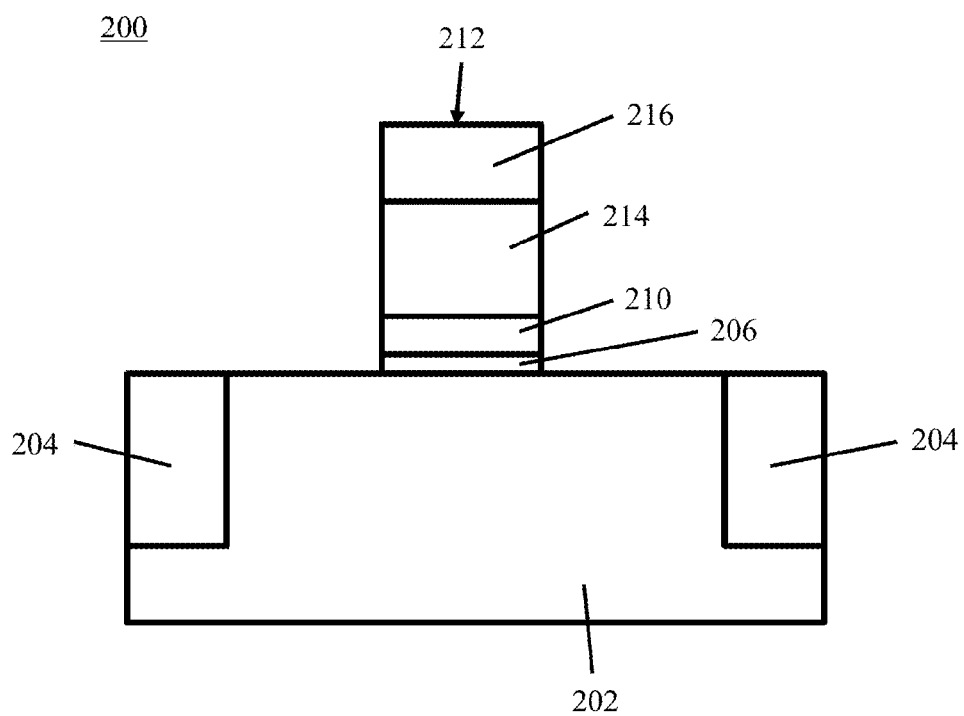
Figure 5C:
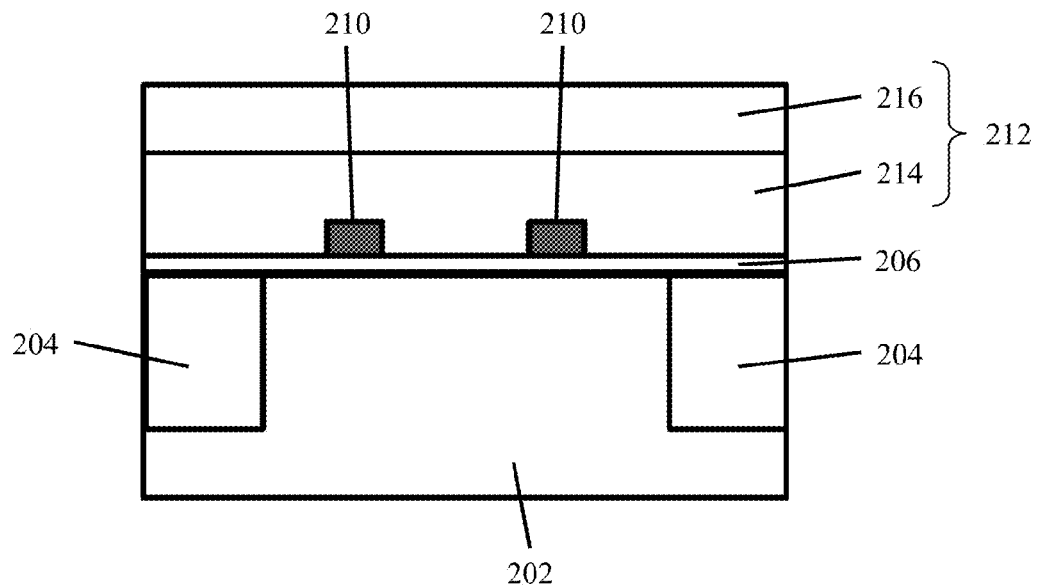

After the sacrificial gate structure 212 is applied over the at least one fin hard mask 210, the sacrificial gate structure 212 may be used as a mask during etching of the at least one fin hard mask 210 and the first oxide layer 206. As shown in FIGS. 5A-5C, the device 200 has been etched to remove a portion of the at least one fin hard mask 210 and a portion of the first oxide layer 206. The sacrificial gate structure 212 preserves the portion of the at least one fin hard mask 210 and the portion of the first oxide layer 206 covered by the sacrificial gate structure 212. As the device 200 is etched the remaining at least one fin hard mask 210 is self-aligned with the sacrificial gate structure 212.

Figure 6A:
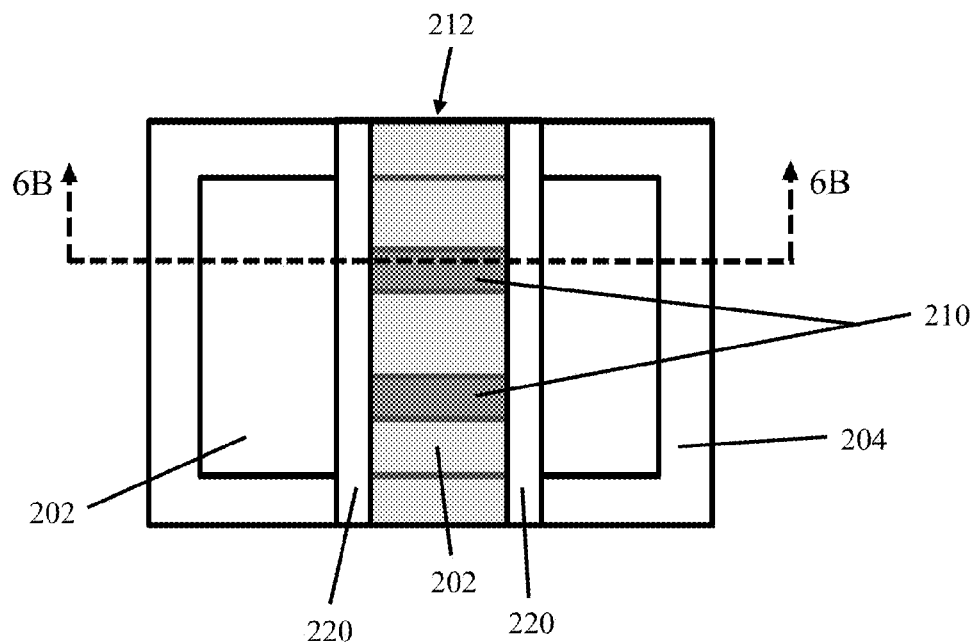
FIGS. 6A-6B depict the intermediate device of FIGS. 5A-5C after application of a first spacer to the side walls of the sacrificial gate structure, in accordance with one or more aspects of the present invention.
Figure 6B:
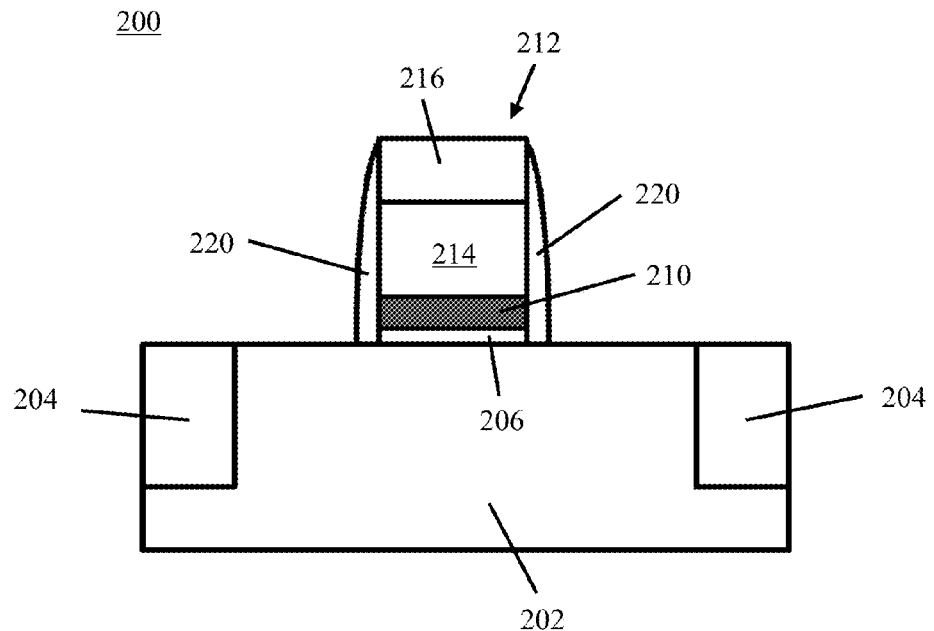
Figure 7A:
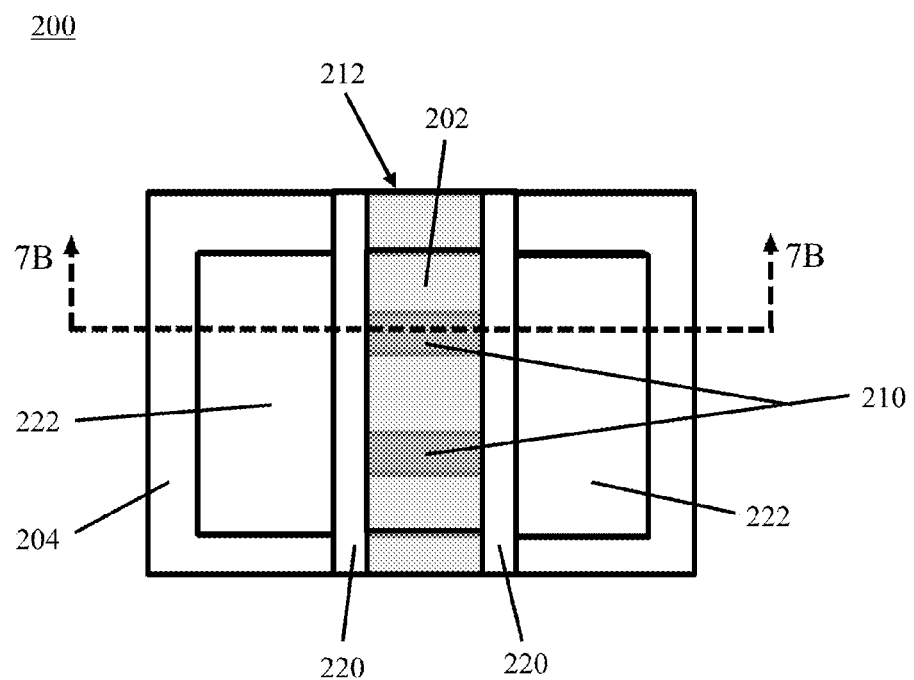
FIGS. 7A-7B depict the intermediate device of FIGS. 6A-6B after performing sigma etching to form the pFET regions, in accordance with one or more aspects of the present invention.
Figure 7B:
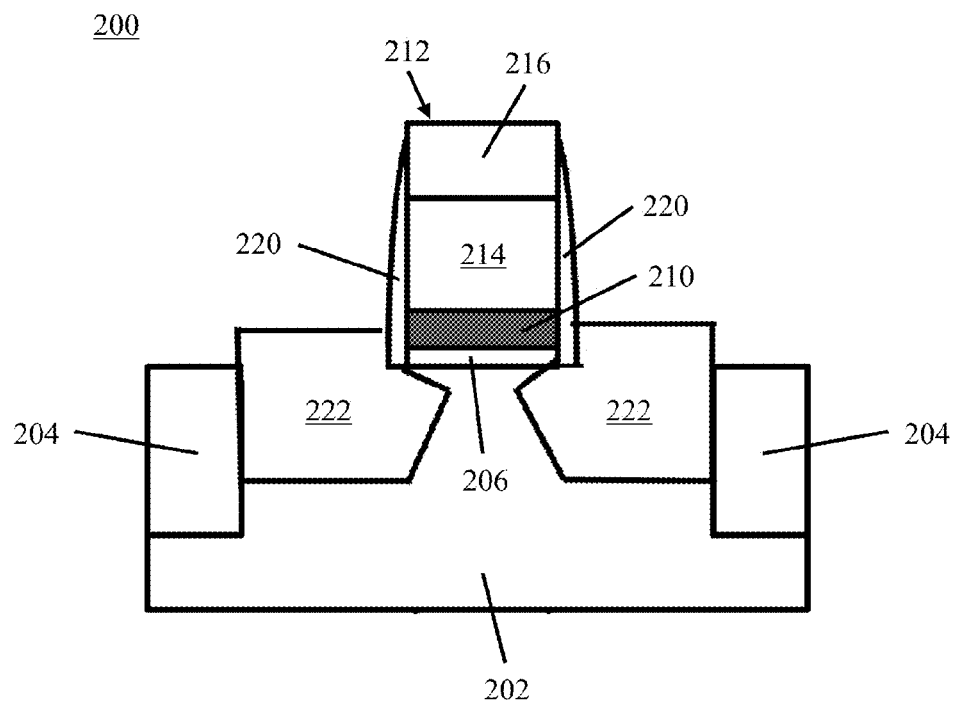

As shown in FIGS. 6A-6B, a first spacer 220 may then be applied to the side walls of the sacrificial gate structure 212. The first spacer 220 may then be etched back to form the desired shape for the first spacer 220. For a pFET region, the first spacer 220 may be, for example, a SiN spacer. Next, as shown in FIGS. 7A-7B, sigma etching may be performed to form the pFET regions 222. After the pFET regions 222 are etched, epitaxial growth may then be performed in the pFET regions 222. The pFET epitaxial growth may be, for example, eSiGe or any other pFET material.

Figure 8A:
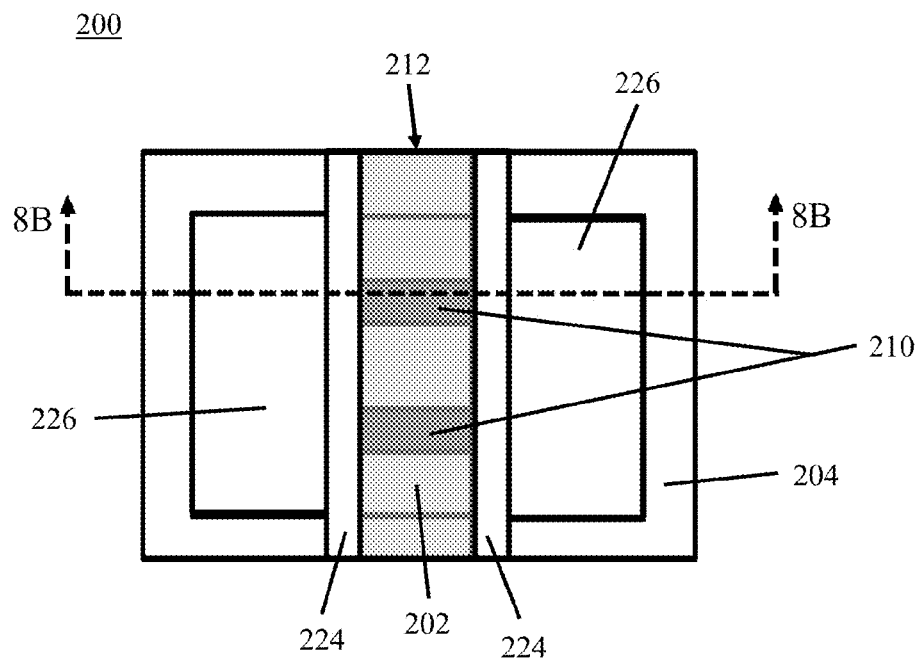
FIGS. 8A-8B depict the intermediate device of FIGS. 7A-7B after application of a second spacer and performing sigma etching to form the nFET regions, in accordance with one or more aspects of the present invention.
Figure 8B:
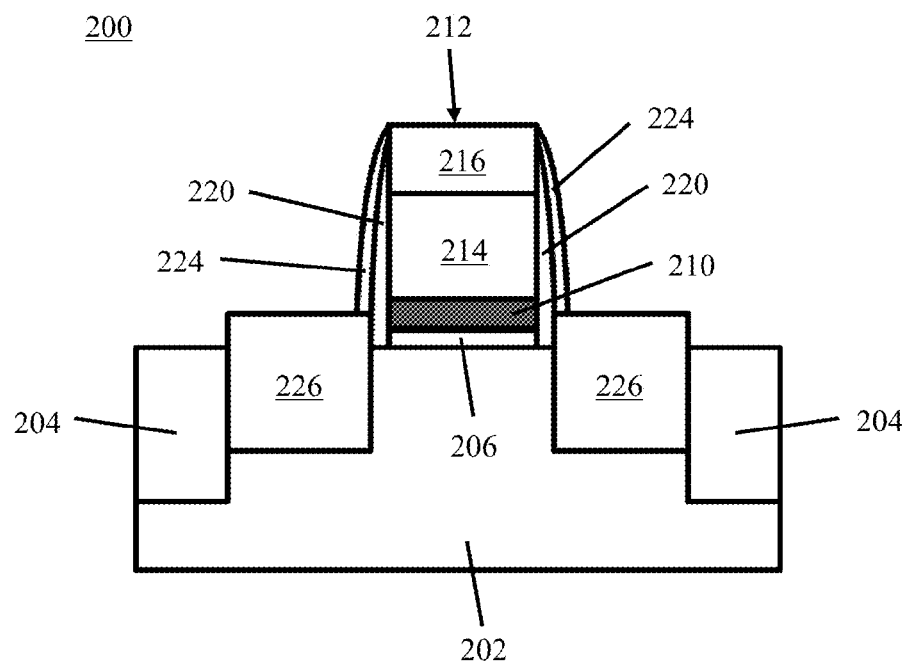

Next, as shown in FIGS. 8A-8B, a second spacer 224 may be applied over the first spacer 220 to the side of the sacrificial gate structure 212. The second spacer 224 may then be etched back to form the desired shape second spacer 224. For an nFET region, the second spacer 224 may be, for example, a SiN spacer. Then sigma etching may be performed to form the nFET regions 226. Next, epitaxial growth may be performed in the nFET regions 226. The nFET expitaxial growth may be, for example, SiP or any other nFET material.

Figure 9A:
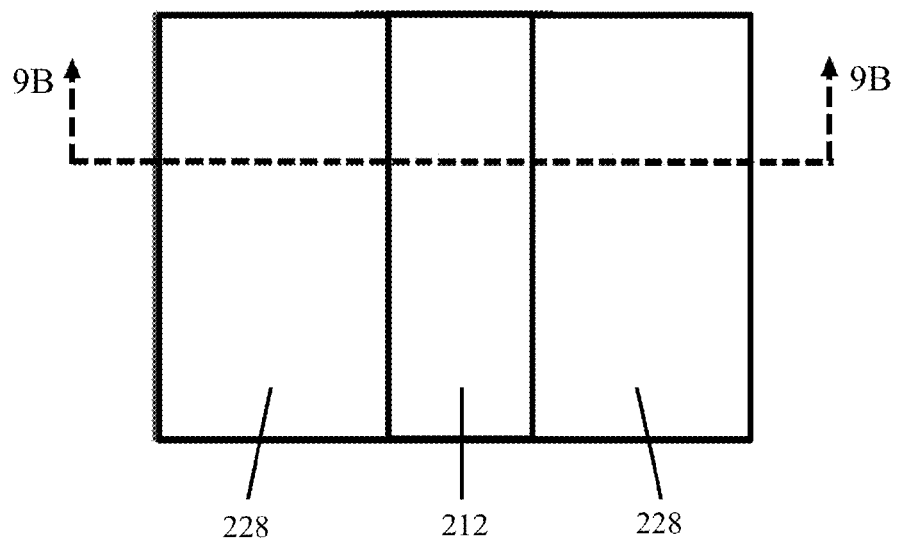
FIGS. 9A-9B depict the intermediate device of FIGS. 8A-8B after depositing a flowable oxide layer over the intermediate device, in accordance with one or more aspects of the present invention.
Figure 9B:
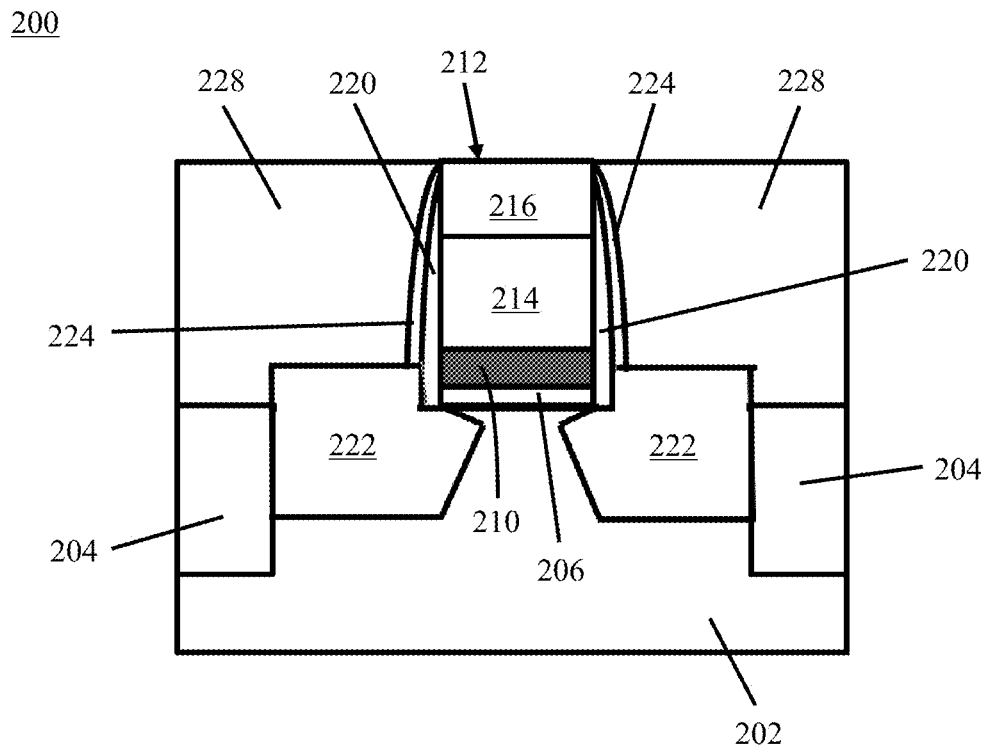

A flowable oxide layer 228 may then be deposited over the device 200 and the surface of the device 200 may be planarized, as shown in FIGS. 9A-9B. The flowable oxide layer 228 may be, for example, a flowable chemical vapor deposition (FCVD) oxide or DUO™. Planarization of the device 200 may be performed by, for example, chemical mechanical planarization (CMP).

Figure 10A:
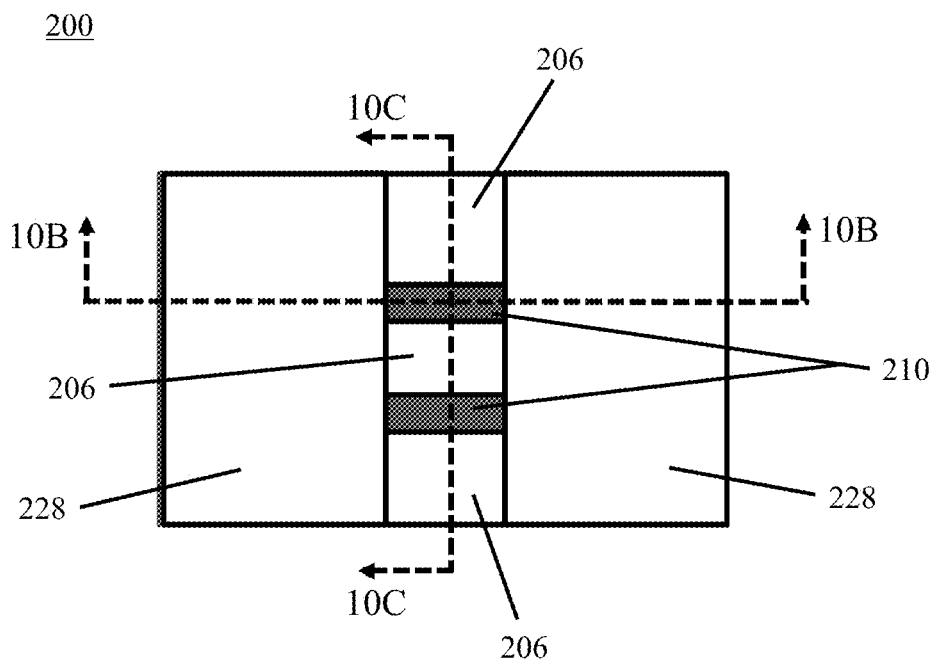
FIGS. 10A-10C depict the intermediate device of FIGS. 9A-9B after removal of the sacrificial gate structure, in accordance with one or more aspects of the present invention.
Figure 10B:
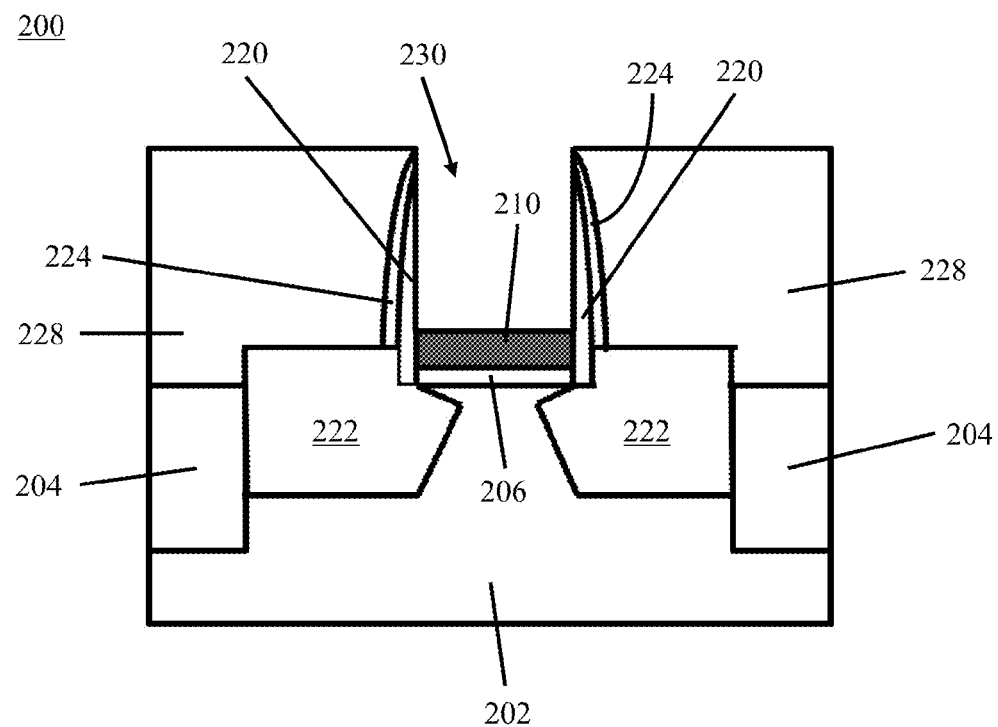
Figure 10C:
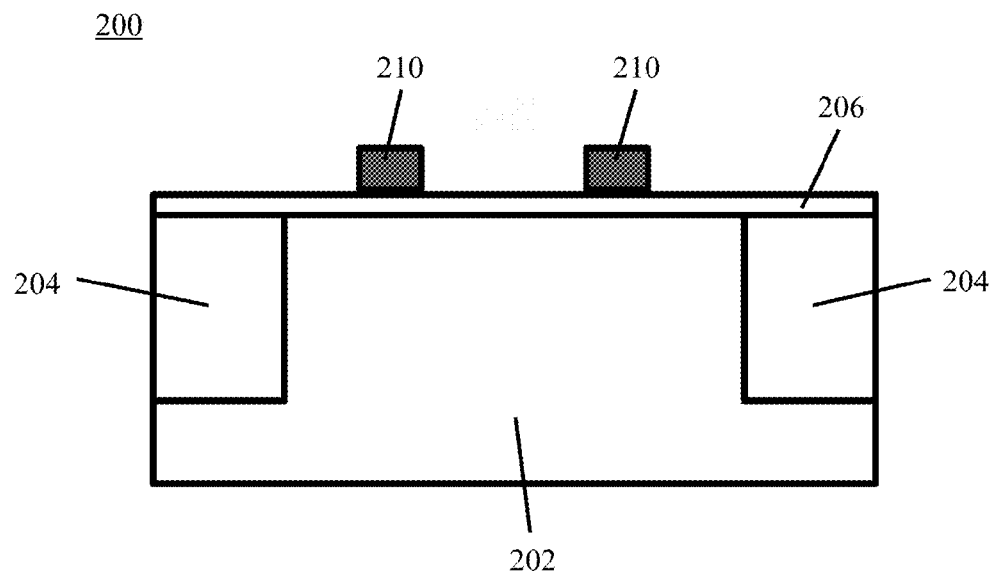
Figure 11A:
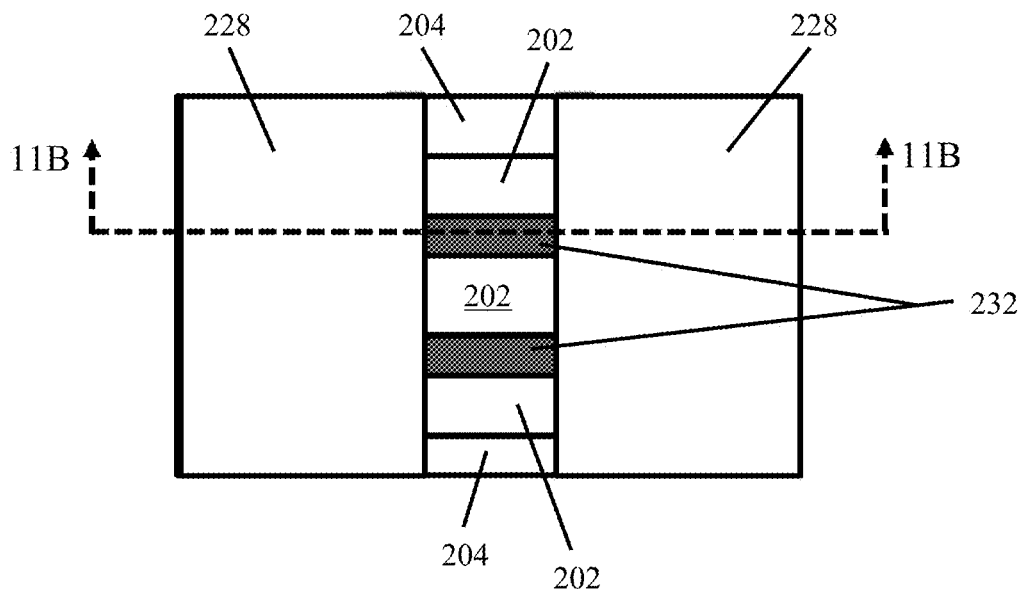
FIGS. 11A-11B depict the intermediate device of FIGS. 10A-10C after etching at least one fin into the substrate, in accordance with one or more aspects of the present invention.
Figure 11B:
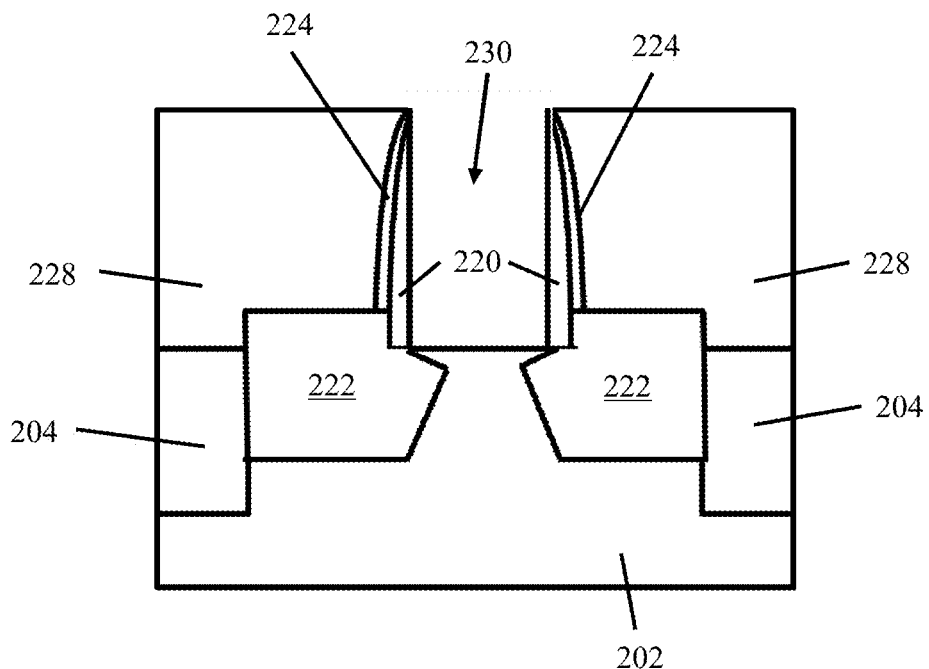

As shown in FIGS. 10A-10C, the replacement metal gate (RMG) process may be performed. The RMG process may include etching the sacrificial gate structure 212 to remove the mask 216 and the oxide material 218 to create an opening 230 between the first spacer 220. When the mask 216 and the oxide material 218 are etched the fin hard mask 210 is revealed. Once the fin hard mask 210 is revealed, etching may be performed using the fin hard mask 210 to etch into the substrate 202 to form at least one fin 232. As the at least one fin 232 is formed during the RMG process the fin is self-aligned to the gate. After the at least one fin 232 is etched into the substrate 202, the fin hard mask 210 may be removed as well as the first oxide layer 206, as shown in FIGS. 11A-11B.

Figure 12A:
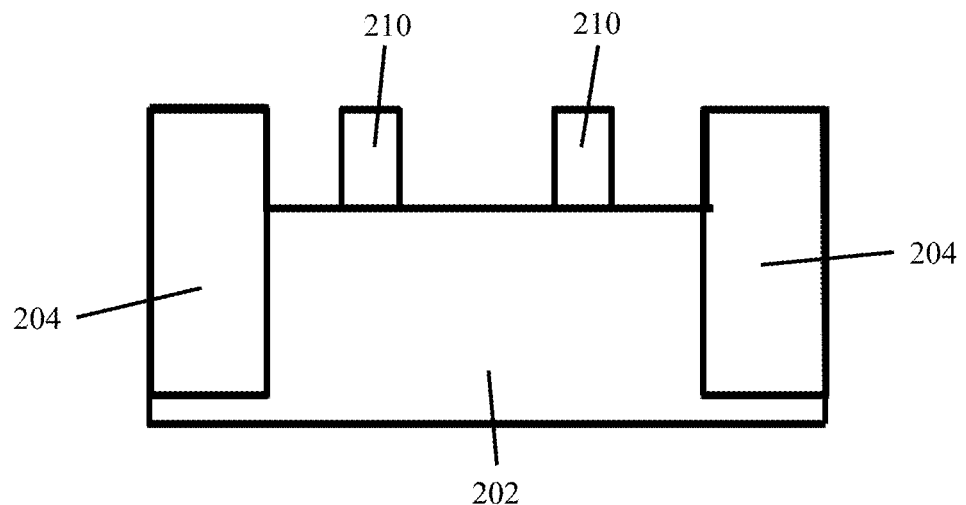
FIGS. 12A-12B depict an intermediate semiconductor device during the formation of at least one fin, in accordance with one or more aspects of the present invention.
Figure 12B:
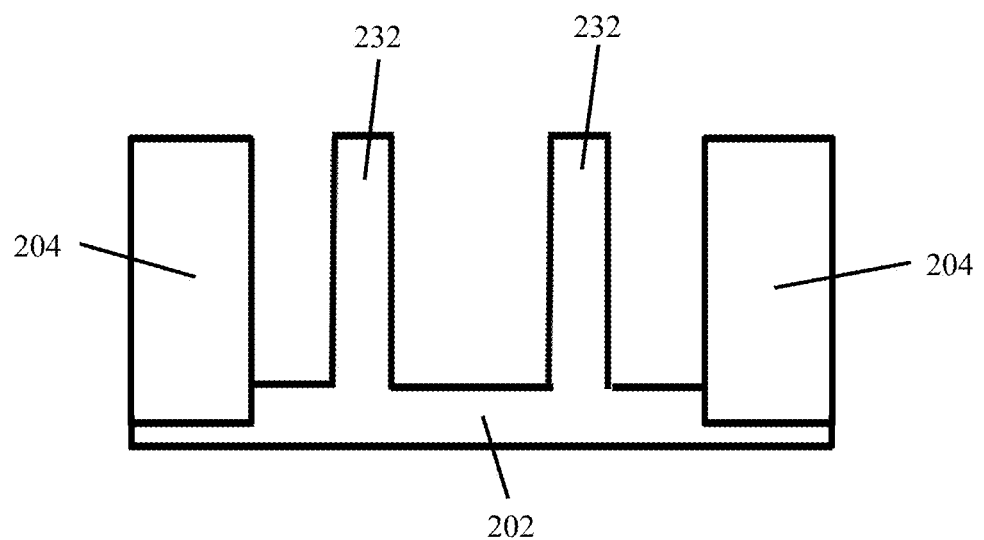

By way of specific example, an intermediate device 250 with a silicon on insulator (SOI) substrate 202 may also be used. Dry anistropic etching may be performed on the intermediate device 250 to form the at least one fin 232, as shown in FIGS. 12A-12B. Then the fin hard mask 210 may be removed, as shown in FIG. 12B.

Figure 13A:
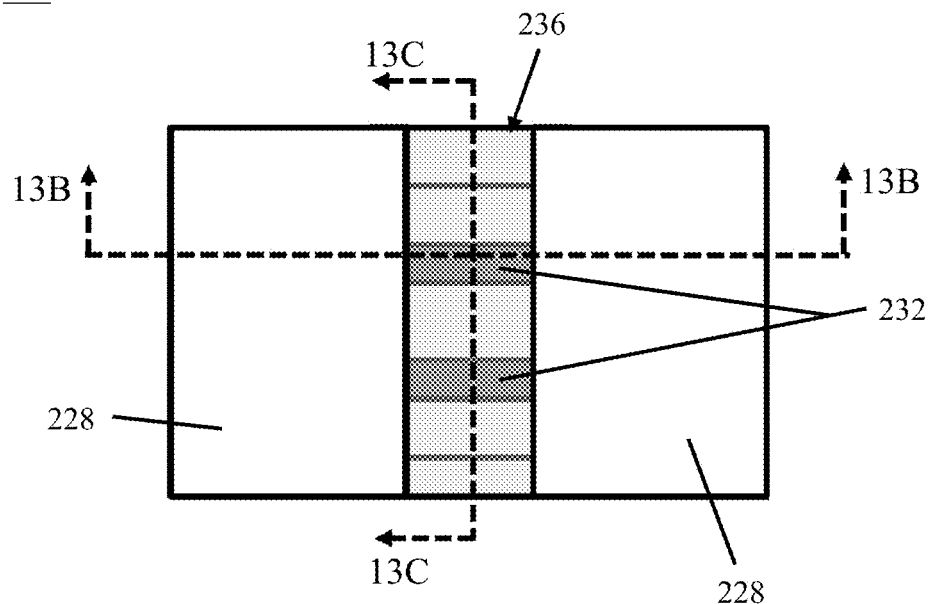
FIGS. 13A-13C depict the intermediate device of FIGS. 11A-11B after application of a barrier layer and deposition of an oxide into the gate opening, in accordance with one or more aspects of the present invention.
Figure 13B:
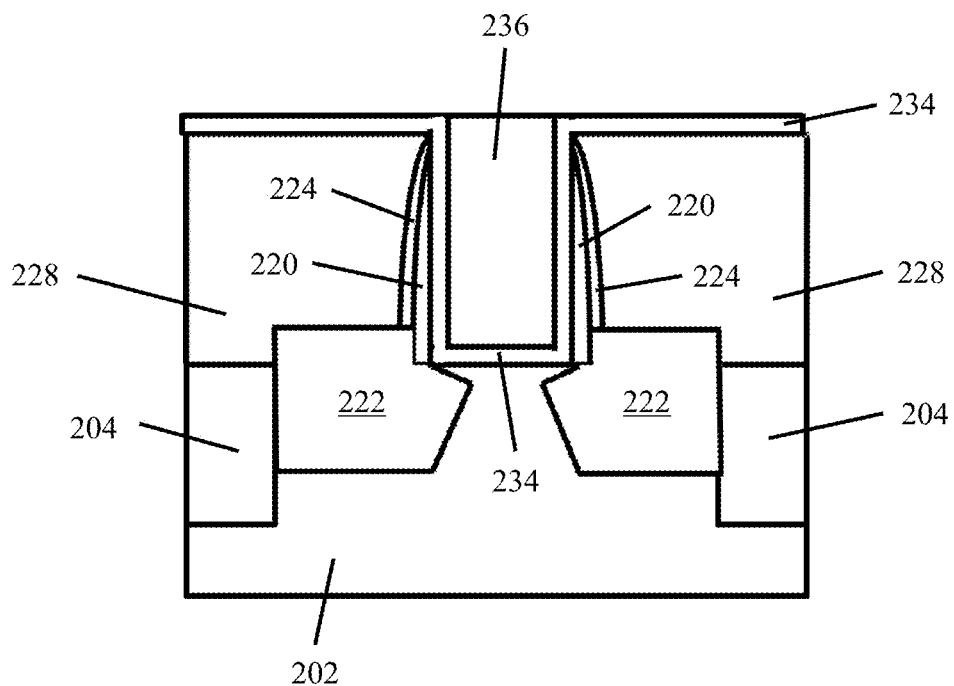
Figure 13C:
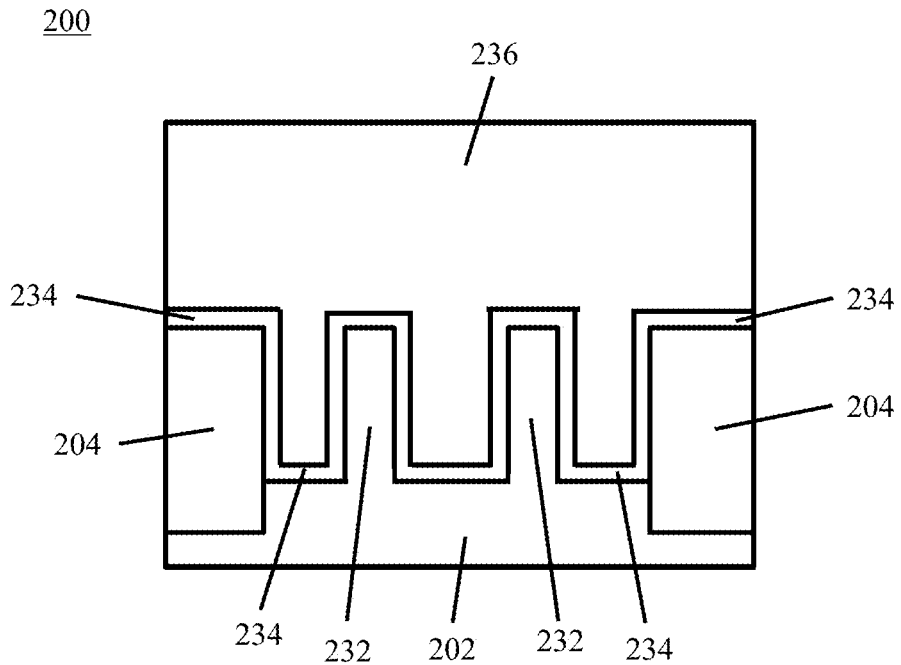

FIGS. 13A-13C show the intermediate device 200 with a thin barrier layer 234 applied over the flowable oxide layer 228 and into the opening 230. The barrier layer 234 may be, for example, SiN. Then an oxide 236 may be deposited over the barrier layer 234 of the device 200 to fill the rest of the opening 230. Next the device 200 may be planarized to remove any extra oxide 236 over the barrier layer 234 on the top surface of the device 200 by, for example, CMP.

Figure 14A:
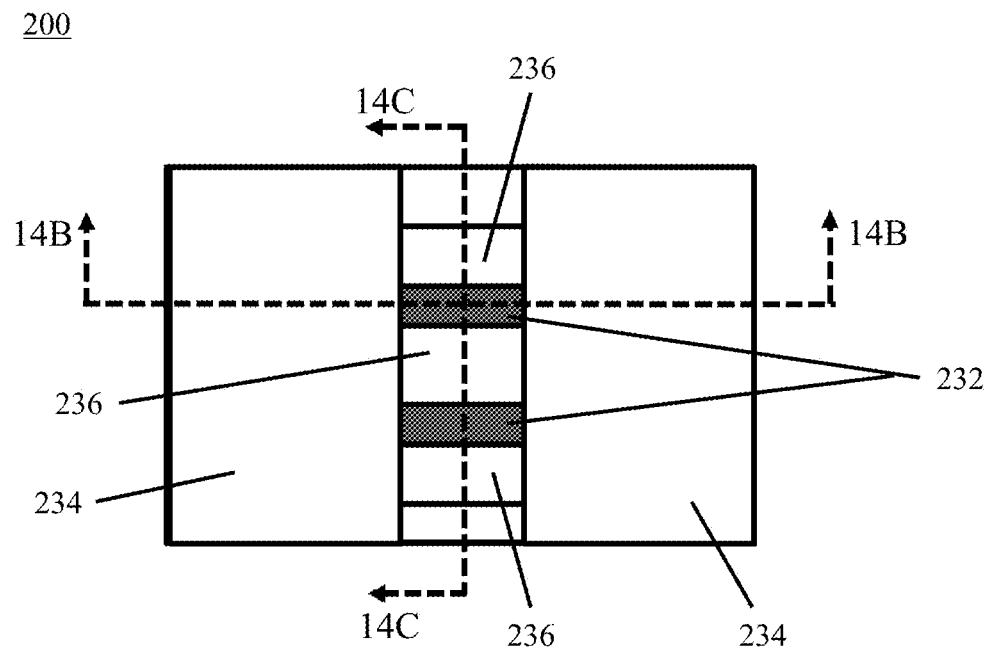
FIGS. 14A-14C depict the intermediate device of FIGS. 13A-13C after etching the oxide in the gate opening, in accordance with one or more aspects of the present invention.
Figure 14B:
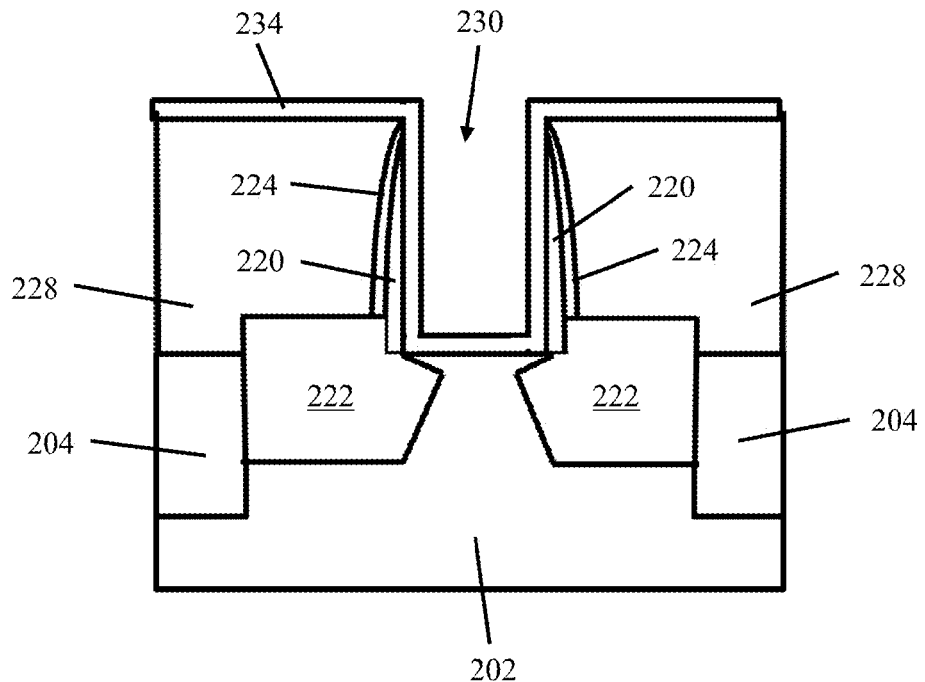
Figure 14C:
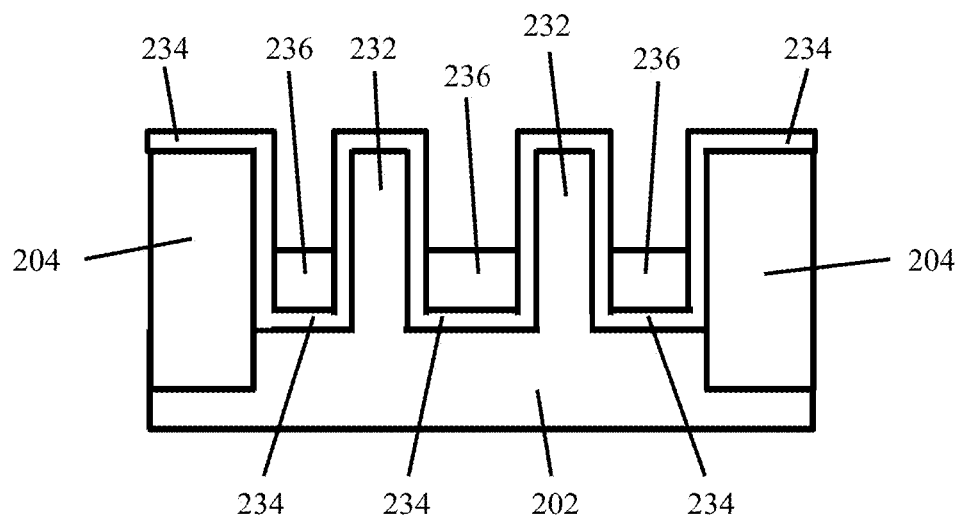
Figure 15A:
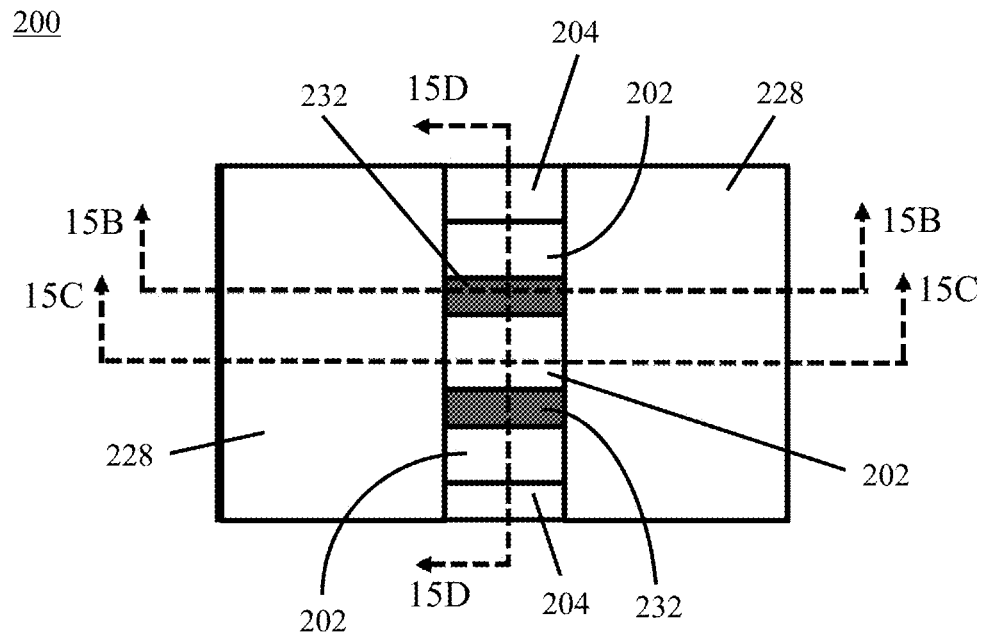
FIGS. 15A-15D depict the intermediate device of FIGS. 14A-14C after etching the barrier layer to form an inner side wall spacer, in accordance with one or more aspects of the present invention.
Figure 15B:
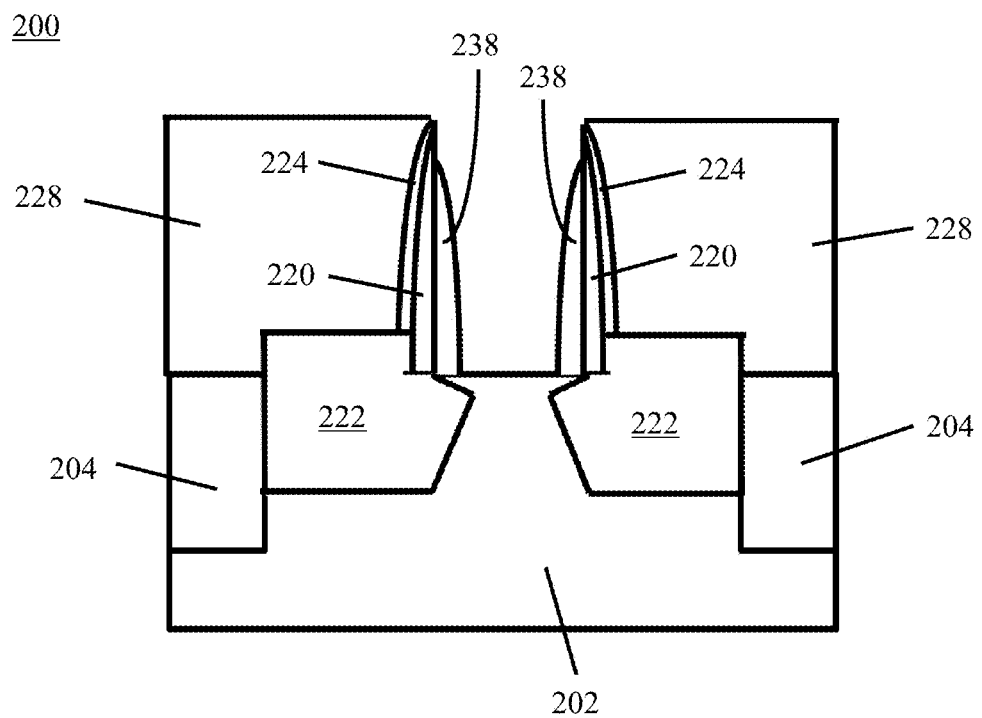
Figure 15C:
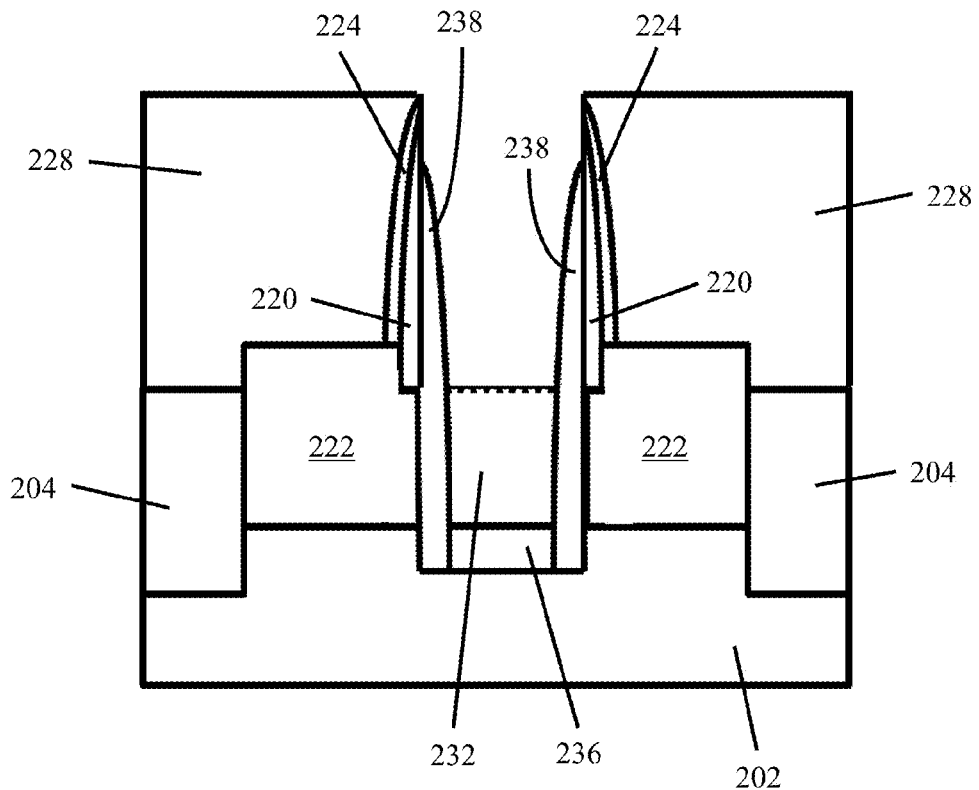
Figure 15D:
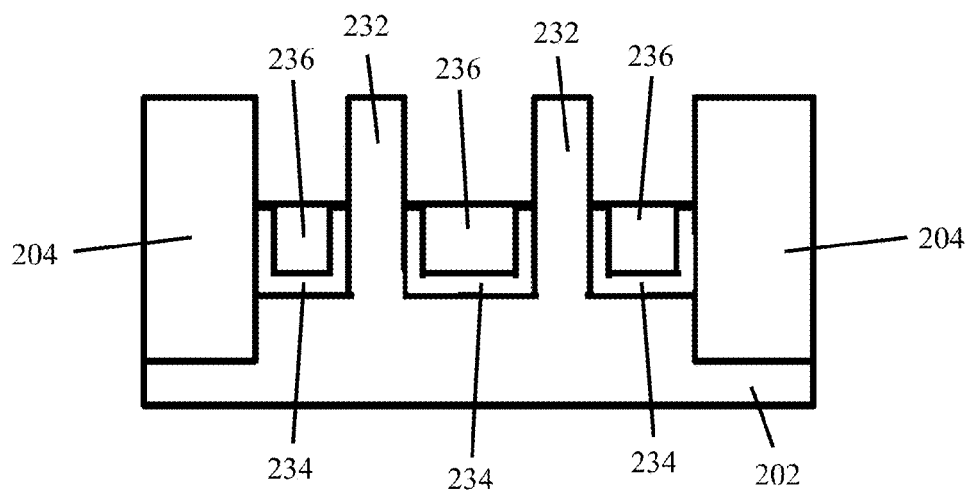
Figure 16A:
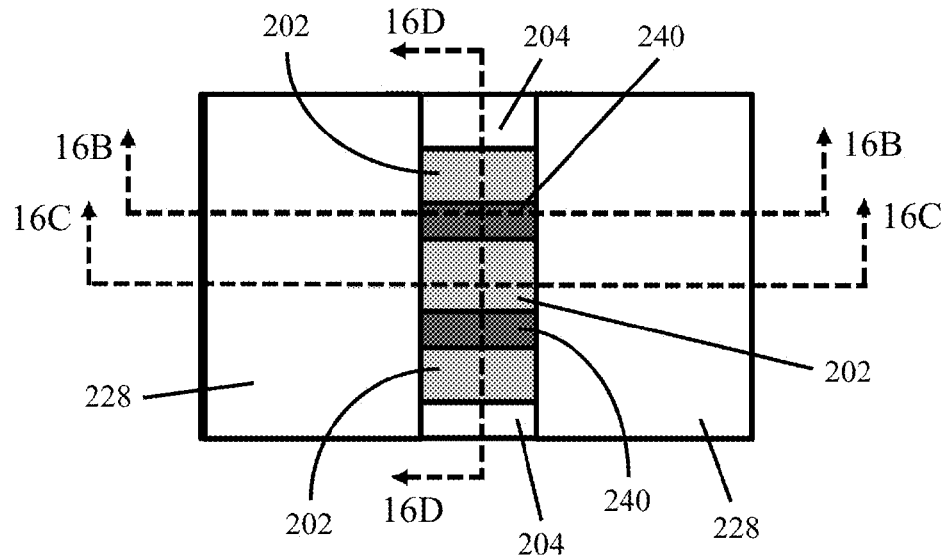
FIGS. 16A-16D depict the intermediate device of FIGS. 15A-15D after a portion of the at least one fin is etched and replaced with a high mobility material, in accordance with one or more aspects of the present invention.
Figure 16B:
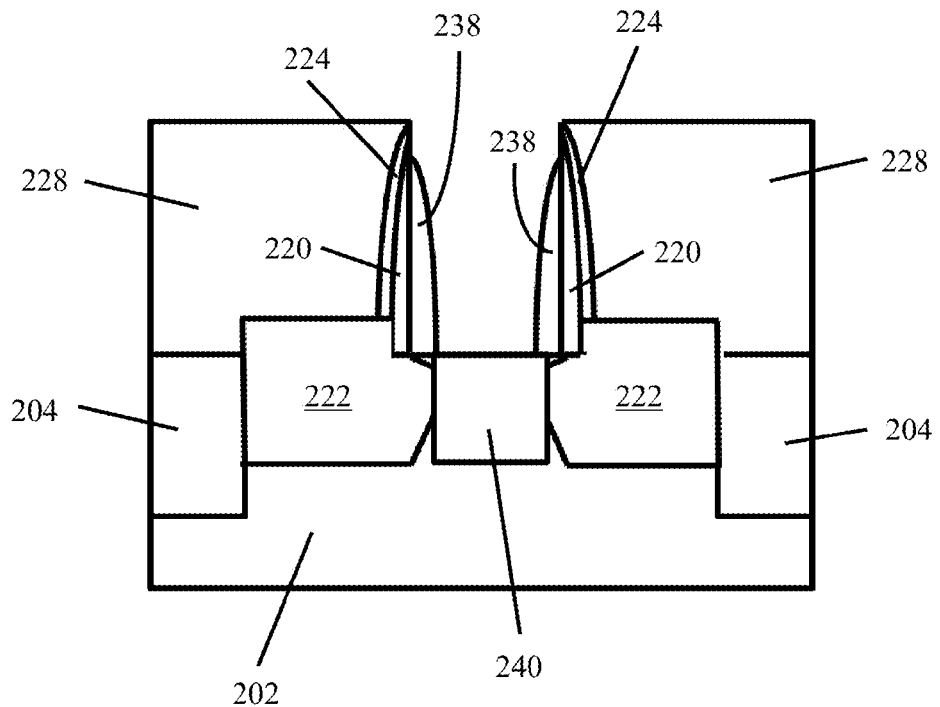
Figure 16C:
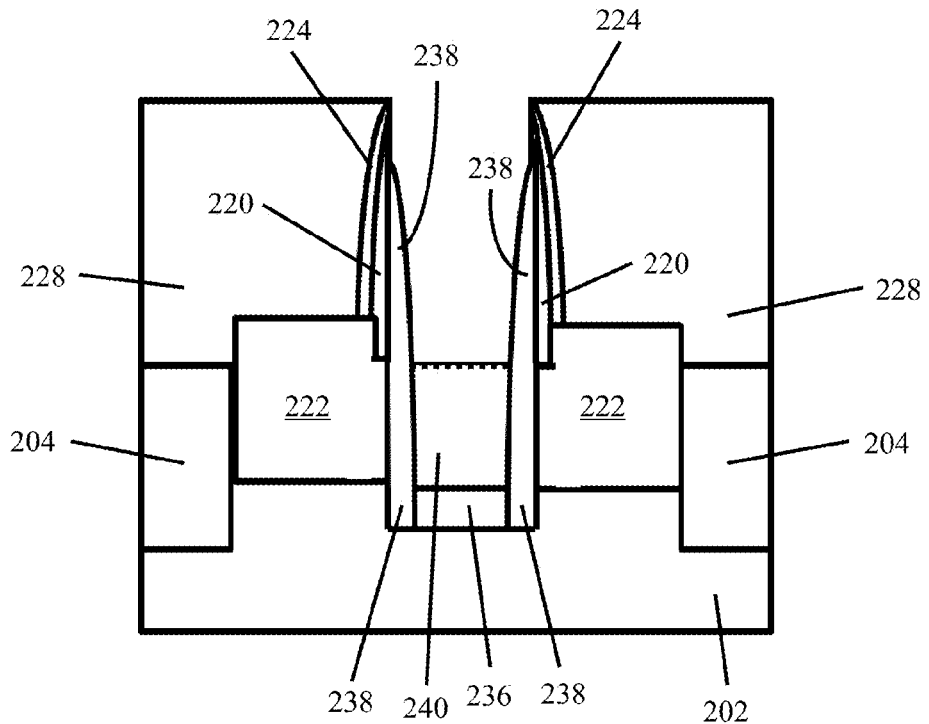
Figure 16D:
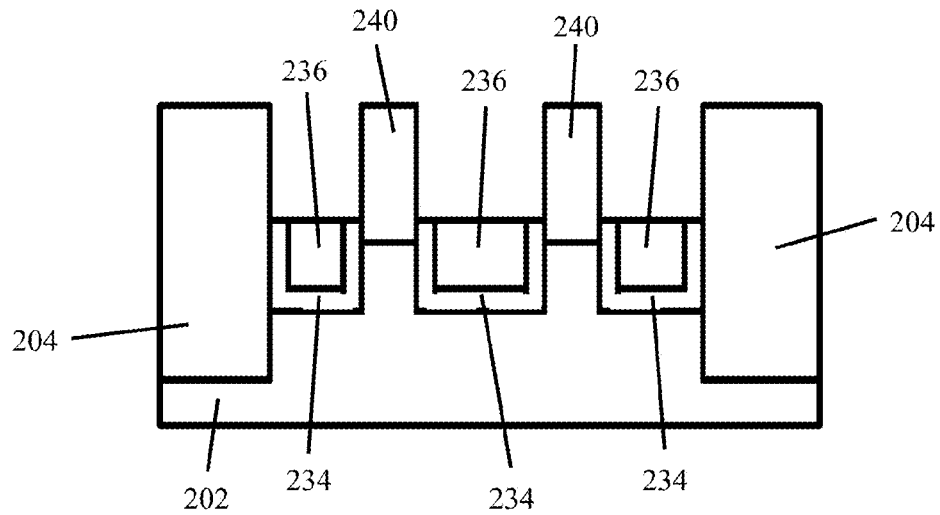

As shown in FIGS. 14A-14C, the oxide 236 may then be etched back to reveal the tip of the at least one fin 232. A portion of the oxide 236 may remain in the bottom of the openings 230 for isolation, as shown in FIG. 14C. Next the barrier layer 234 may be etched to form an inner side wall spacer 238 and to reveal the fins 232, as shown in FIGS. 15A-15D. The inner spacer 238 may be aligned at least partially with the first and second spacers 220, 224, as shown in FIGS. 15B-15C. The inner spacer 238 may be, for example, wider at the top of the opening 230 and narrower at the bottom of the opening 230, as shown in FIG. 15B. This shape may enable better deposition of the gate material.

In one embodiment, as shown in FIGS. 16A-16D, the fins 232 of the device 200 may include high mobility channels 240 made of high mobility materials. The high mobility materials for the channels 240 may include, for example, SiGe or other materials from Groups III-V. If high mobility channels 240 are desired for the device 200, then a portion of the revealed fins 232 may be etched away. Next an epitaxy process may be performed to grow new channels 240 in place of the removed portions of the fins 232.

Figure 17A:
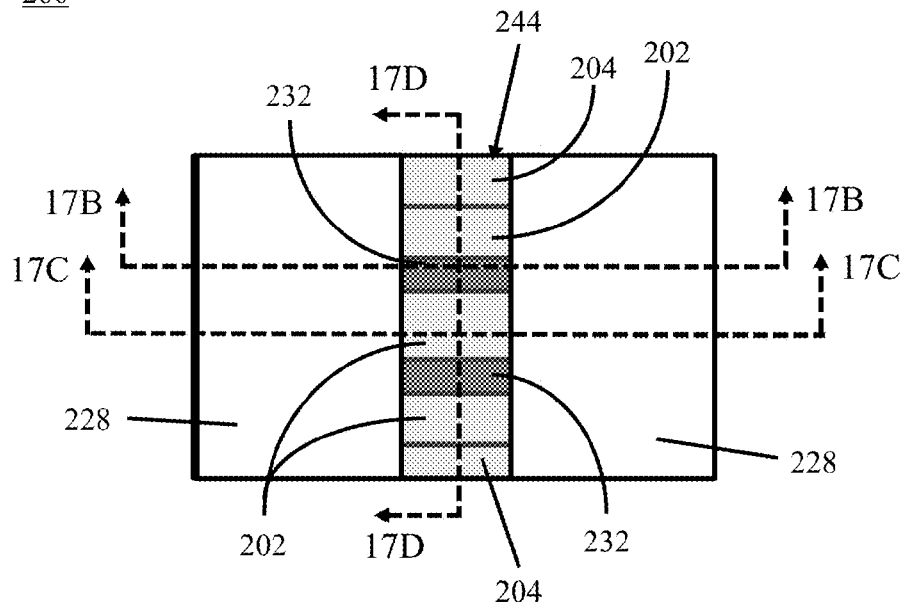
FIGS. 17A-17D depict the intermediate device of FIGS. 15A-15D after deposition of a dielectric layer and the gate material over the at least one fin, in accordance with one or more aspects of the present invention.
Figure 17B:
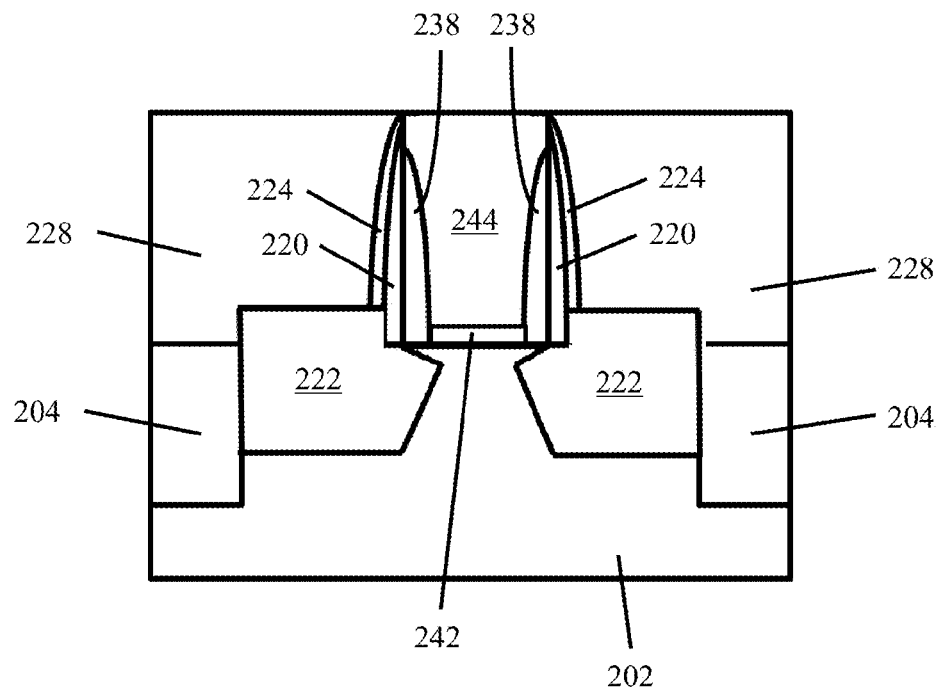
Figure 17C:
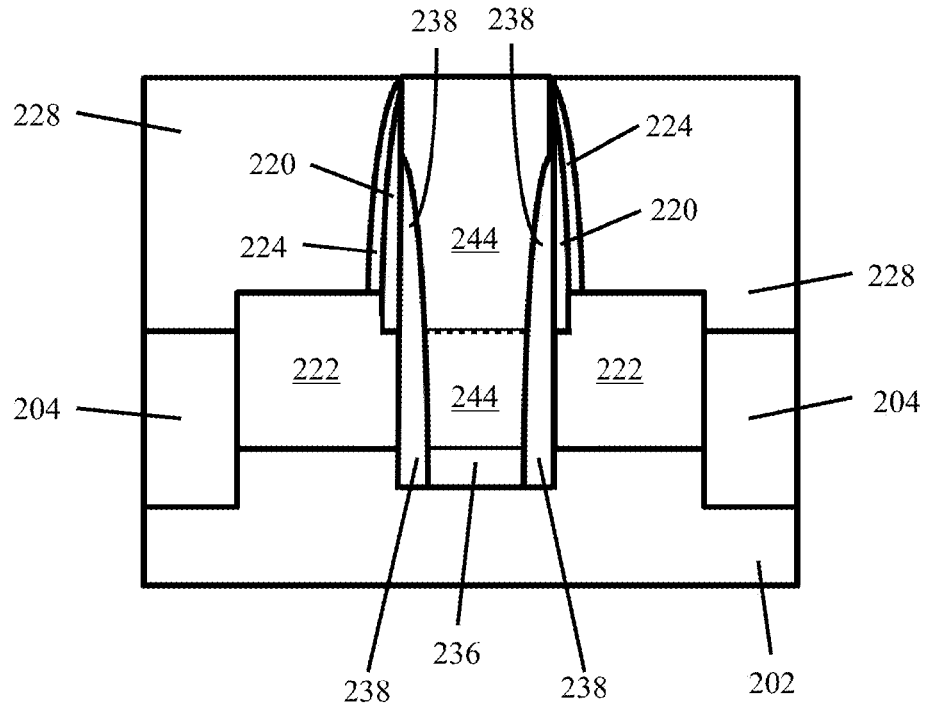
Figure 17D:
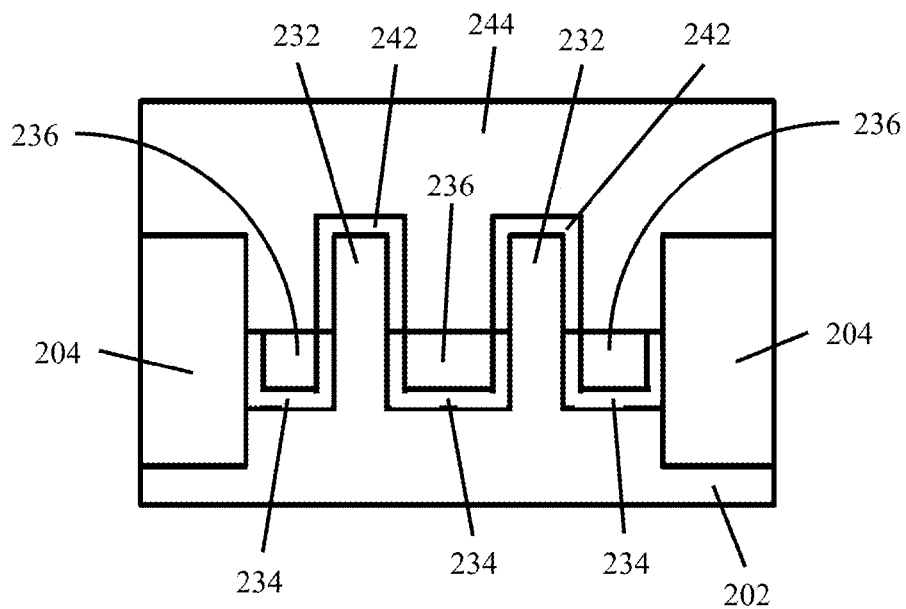

Once the fins 232 are revealed, the gate deposition process may be performed, as shown in FIGS. 17A-17D. The gate deposition process may include applying a dielectric layer 242 over the fins 232, as shown in FIGS. 17B and 17D. The dielectric layer 242 may be, for example, a high-k dielectric material, such as an oxide. Next a gate material 244 may be deposited into the opening 230 over the dielectric layer 242. The gate material 244 may be, for example, a metal gate, a polysilicon gate, or any other known gate material. Then CMP may be performed to remove any extra material on the surface of the device 200 left during depositing of the gate material 244.

Figure 18:
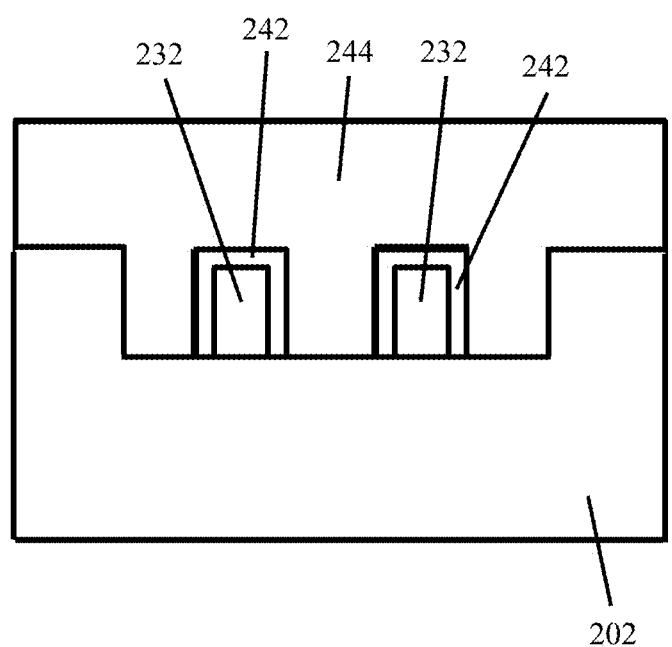
FIG. 18 depicts the intermediate device of FIGS. 12A-12B after deposition of a dielectric layer and gate material over the at least one fin, in accordance with one or more aspects of the present invention.

As shown in FIG. 18, the device 250 with a SOI substrate may skip the fabrication steps described above with reference to FIGS. 13A-15D for exposing the fins 232 and proceed to gate deposition. As described above with reference to FIGS. 17A-17D, a dielectric layer 242 may be deposited over the fins 232. Then a gate material 244 may be deposited over the device 250. After the gate material 244 is applied, CMP may be performed on the device to remove any extra material left on the device during deposition of the gate material 244 and stopping on the flowable oxide layer 228.

Following the gate deposition processes, shown in FIGS. 17A-18, the devices 200, 250 may be passed to MOL and BEOL processes to continue with the fabrication process. If silicidation is performed on the devices 200, 250, it may be performed as it would be on a planar device making the silicidation process easier than the silicidation process performed during conventional FinFET fabrication.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A method comprising:
obtaining an intermediate semiconductor device, comprising:
a substrate with at least one shallow trench isolation region;
depositing a hard mask layer over the intermediate semiconductor device;
etching the hard mask layer to form at least one fin hard mask;
depositing at least one sacrificial gate structure over the at least one fin hard mask and at least a portion of the substrate;
etching the intermediate semiconductor device to remove a portion of the at least one fin hard mask using the at least one sacrificial gate structure as a mask;
applying a first spacer to the at least one sacrificial gate structure;
forming at least one pFET region in the substrate;
applying a second spacer to the at least one sacrificial gate structure over the first spacer;
forming at least one nFET region in the substrate;
depositing a flowable oxide over the intermediate semiconductor device;
removing the at least one sacrificial gate structure to form at least one opening;
etching over the at least one fin hard mask to form at least one fin in a bottom of the opening; and
removing the at least one fin hard mask.

2. The method of claim 1, further comprising:
applying a barrier layer to the intermediate semiconductor device over the at least one fin; and
depositing an oxide over the barrier layer.

3. The method of claim 2, further comprising:
etching the oxide to reveal the at least one fin.

4. The method of claim 3, further comprising:
etching the barrier layer to form an inner side wall spacer in the at least one opening and to reveal the at least one fin.

5. The method of claim 4, further comprising:
etching the at least one fin to remove a portion of the at least one fin; and
growing a high mobility channel to replace the removed portion of the at least one fin.

6. The method of claim 4, further comprising:
depositing a dielectric layer into the at least one opening over the at least one fin; and
depositing a gate material over the dielectric layer.

7. The method of claim 1, further comprising:
forming at least one fin during a replacement metal gate formation process.

* * * * *